United States Patent
Jung et al.

(10) Patent No.: US 10,490,629 B2
(45) Date of Patent: Nov. 26, 2019

(54) METHOD FOR FABRICATING POWER SEMICONDUCTOR DEVICE

(71) Applicant: Semiconductor Manufacturing International (Shanghai) Corporation, Shanghai (CN)

(72) Inventors: Dae Sub Jung, Shanghai (CN); Bo Liu, Shanghai (CN); Roger To-Hoi Szeto, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 16/019,090

(22) Filed: Jun. 26, 2018

(65) Prior Publication Data
US 2018/0308932 A1    Oct. 25, 2018

Related U.S. Application Data

(62) Division of application No. 15/017,825, filed on Feb. 8, 2016, now Pat. No. 10,032,865.

(30) Foreign Application Priority Data

Mar. 30, 2015    (CN) .......................... 2015 1 0144340

(51) Int. Cl.
*H01L 29/78*    (2006.01)
*H01L 29/40*    (2006.01)
(Continued)

(52) U.S. Cl.
CPC ...... *H01L 29/0661* (2013.01); *H01L 29/0619* (2013.01); *H01L 29/0865* (2013.01); *H01L 29/267* (2013.01); *H01L 29/66333* (2013.01); *H01L 29/66712* (2013.01); *H01L 29/7395* (2013.01); *H01L 29/7811* (2013.01);
(Continued)

(58) Field of Classification Search
CPC .......... H01L 29/0661; H01L 29/66712; H01L 29/7393; H01L 29/7811; H01L 29/66333; H01L 29/1095; H01L 29/0653; H01L 29/0611; H01L 29/7397; H01L 29/0619
See application file for complete search history.

(56) References Cited

U.S. PATENT DOCUMENTS 6,114,727 A    9/2000    Ogura et al.
7,250,639 B1    7/2007    Suekawa
(Continued)

FOREIGN PATENT DOCUMENTS

CN    102214689 A    10/2011

*Primary Examiner* — Mohsen Ahmadi
(74) *Attorney, Agent, or Firm* — Anova Law Group, PLLC (57) ABSTRACT

A method for forming power semiconductor device is provided. The power semiconductor device includes a substrate having a device region and a surrounding termination region; and at least a power device formed in the device region of the substrate. The power semiconductor substrate also includes a termination structure having a plurality of semiconductor plugs formed in a first surface of the termination region of the substrate. Wherein the plurality of the semiconductor plugs are formed in a plurality of ring trenches formed in the first surface of the substrate in the termination regions, with a semiconductor plug formed in each of the plurality of ring trenches.

14 Claims, 8 Drawing Sheets

(51) Int. Cl.
  *H01L 29/06*     (2006.01)
  *H01L 29/739*    (2006.01)
  *H01L 29/08*     (2006.01)
  *H01L 29/66*     (2006.01)
  *H01L 29/267*    (2006.01)
  *H01L 29/10*     (2006.01)

(52) U.S. Cl.
  CPC ....... *H01L 29/0611* (2013.01); *H01L 29/0653* (2013.01); *H01L 29/1095* (2013.01); *H01L 29/7397* (2013.01)

(56) References Cited

U.S. PATENT DOCUMENTS

| | | | |
|---|---|---|---|
| 8,492,260 B2* | 7/2013 | Parsey, Jr. | H01L 21/76898 257/E21.586 |
| 9,391,135 B1* | 7/2016 | Grivna | H01L 29/7397 |
| 9,620,631 B2* | 4/2017 | Matsudai | H01L 29/7397 |
| 2002/0175383 A1 | 11/2002 | Kocon et al. | |
| 2004/0056302 A1* | 3/2004 | Grebs | H01L 29/402 257/328 |
| 2005/0173776 A1* | 8/2005 | Dalen | H01L 29/0619 257/483 |
| 2005/0176192 A1 | 8/2005 | Hshieh | |
| 2006/0278924 A1 | 12/2006 | Kao | |
| 2008/0111207 A1 | 5/2008 | Lee et al. | |
| 2010/0207205 A1* | 8/2010 | Grebs | H01L 23/544 257/334 |
| 2012/0074491 A1* | 3/2012 | Ohta | H01L 29/0634 257/334 |
| 2012/0299094 A1 | 11/2012 | Lee et al. | |
| 2014/0027781 A1 | 1/2014 | Ryu | |
| 2014/0070375 A1* | 3/2014 | Grivna | H01L 23/481 257/621 |
| 2014/0167150 A1 | 6/2014 | Um et al. | |
| 2015/0162410 A1* | 6/2015 | Padmanabhan | H01L 29/407 257/488 |
| 2016/0293595 A1 | 10/2016 | Narazaki et al. | |
| 2016/0336393 A1 | 11/2016 | Kim et al. | |

* cited by examiner

METHOD FOR FABRICATING POWER SEMICONDUCTOR DEVICE

CROSS-REFERENCES TO RELATED APPLICATIONS

This application is a divisional of U.S. patent application Ser. No. 15/017,825, filed on Feb. 8, 2016, which claims the priority of Chinese patent application No. 201510144340.6, filed on Mar. 30, 2015, the entirety of which is incorporated herein by reference.

FIELD OF THE INVENTION

The present invention generally relates to the field of semiconductor technology and, more particularly, relates to methods for fabricating power semiconductor devices.

BACKGROUND

In the field of the semiconductor technology, power devices are usually used as switches. Usually, it requires the power devices to endure a relative high turn-off voltage, and to have a relatively low on-state voltage. The commonly used power devices include Insulated-Gate Bipolar Transistors (IGBTs), or Vertical Double-diffused Metal-oxide Semiconductor (VDMOS) field effect transistors, etc.

Figure 1:
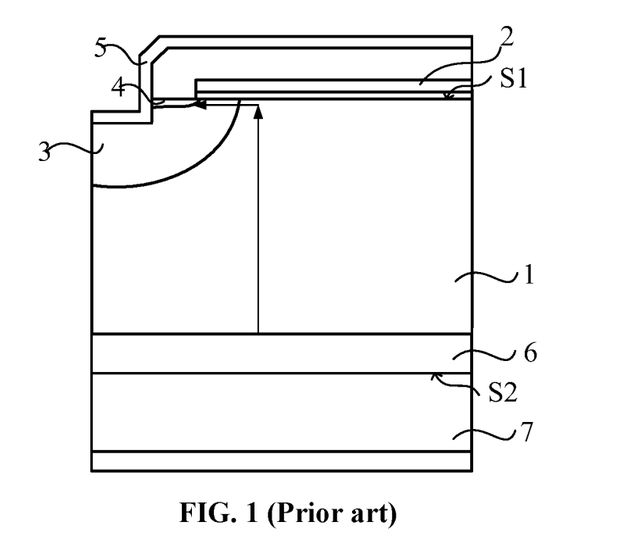
FIG. 1 illustrates an existing IGBT structure.

FIG. 1 illustrates an existing IGBT. As shown in FIG. 1, the IGBT includes a substrate 1 doped with N-type ions; a gate 2 formed on the front surface S1 of the substrate 1; a P-type well region 3 formed in the substrate 1 and penetrating under the gate 2; and a source 4 doped with N-type ions formed in the P-type well region 3 at one side of the gate 2. The source 4 and the P-type well region 3 are electrically connected by the metal electrode 5; and the gate 2 and the metal electrode 5 are electrically insulated. Further, the IGBT also includes a buffer layer 6 doped with N-type ions formed on the back surface S2 of the substrate 1; and a collector layer 7 doped with P-type ions formed on the buffer layer 6. Along a direction perpendicular to the front surface S1, the P-type well region 3, the substrate 1, and the collector layer 7 form a PNP-type IGBT. The substrate 1 is the substrate of the PNP-type IGBT; and the P-type well region 3 is configured as the emitter of the PNP-type IGBT.

During the process for turning on and turning off the IGBT, a positive voltage is always applied on the collector layer 7. To turn on the IGBT, a turn-on voltage is applied between the gate 2 and the metal electrode 5 to form a channel on the surface of the P-type well region 3 under the gate 2. Thus, a base current is provided to the PNP-type IGBT; and the PNP-type IGBT is turned on. As shown in FIG. 1, the arrows illustrate the current direction. The doping concentration of the buffer layer 6 is higher than the doping concentration of the substrate 1. The N-type carriers in the buffer layer 6 diffuse into the substrate 1. Thus, the concentration of the carriers in the substrate 1 is increased; and the current is increased as well. Accordingly, the on-state voltage of the IGBT is reduced. To turn off the PNP-type IGBT, a turn-off voltage is applied between the gate 2 and the metal electrode 5. The channel disappears, and the PNP-type IGBT is turned off.

Because the positive voltage is always applied on the collector layer 7. Therefore, the PN junctions between the P-type well region 3 and the substrate 1 are reversely biased at off state. At the edge and corner of a power device, the breakdown voltage will be reduced because of the junction curvature.

To maintain the breakdown voltage of a power device, one approach is to form a termination structure around the power device. The termination structure may reduce the electric field peak at the corner and edge of a power device. Thus, the breakdown voltage of the power device is ensured. Further, after the subsequent wafer dicing process along the crube line in the substrate 1, the side surface of the substrate 1 may be uneven, the termination structure is able to prevent a current leakage issue caused by the depletion region end at the uneven side wall of the a power device die at off-state A termination structures include field plates, field limit rings, or a combination thereof. The termination structures also includes deep-ring-trench termination structures, etc. The termination structure having a combination of field limit rings and field plate occupies a relatively large area of the power semiconductor device. Thus, the size of the power device having such a termination structure is relatively large.

Further, it needs extra processes to form the deep-ring-trench termination structure. The production cost is increased. The extra processes also affect the performance of cell structure of the power semiconductor device.

The disclosed device structures and methods are directed to solve one or more problems set forth above and other problems.

BRIEF SUMMARY OF THE DISCLOSURE

One aspect of the present disclosure includes providing a power semiconductor device. The power semiconductor device includes a substrate having a device region and a surrounding termination region; and at least a power device formed in the device region of the substrate. The power semiconductor substrate also includes a termination structure having a plurality of semiconductor plugs formed in a first surface of the termination region of the substrate. Wherein the plurality of the semiconductor plugs are formed in a plurality of ring trenches formed in the first surface of the substrate in the termination regions, with a semiconductor plug formed in each of the plurality of ring trenches.

Another aspect of the present disclosure includes providing a method for forming a power semiconductor device. The method includes providing a substrate having a device region and a surrounding termination region; and forming at least one power device in the device region. The method also includes forming a plurality of ring trenches in a first surface of the substrate in the termination region; and forming a semiconductor plug in each of the plurality of ring trenches. Wherein the plurality of semiconductor plugs and the substrate form a termination structure of the power semiconductor device to insulate the at least one power device in the device region.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 2:
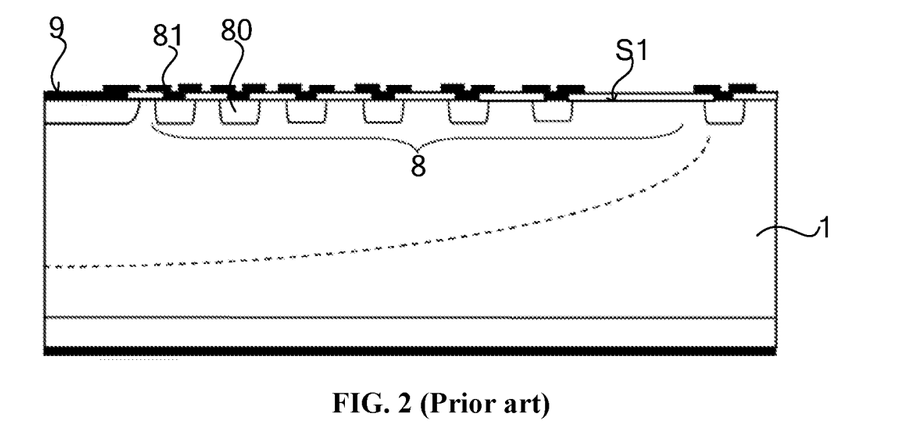
FIG. 2 illustrates an existing termination structure.

FIG. 2 illustrates a termination structure having a combination of field limit rings and field plates. As shown in FIG. 2, the termination structure 8 includes a plurality of field limit rings 80 surrounding the power device. Each of the plurality of the field rings 80 may be connected with a field plate 81. The field plates 81 may be connected with other external device structures. Further, each of the plurality of field rings 80 may be formed by performing an ion implantation process on the first surface S1 of the substrate 1. The doping type of the field limit rings 80 may be opposite to the doping type of the substrate 1. During a turning off process of the IGBT, a bias voltage is applied on the field plates 81, the electric field lines in the substrate 1 radiate into the field limit rings 80. Thus, the electric field is divided; the accumulation of the surface electric field is inhibited; and the voltage endurance characteristic of the power device is increased. However, because the depth of the ion implantation process may be relatively small, to increase the electric field dividing effect, it needs to increase the number of the field rings. As a result, the termination structure would occupy a relatively large area of the substrate 1.

Figure 3:
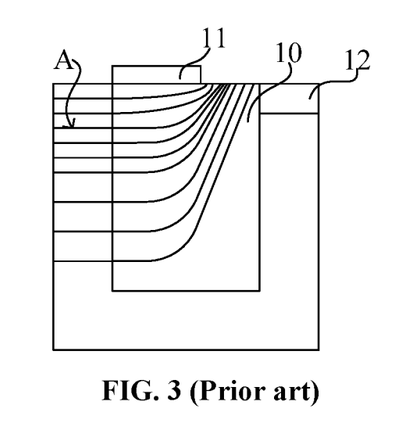
FIG. 3 illustrates another existing termination structure.

FIG. 3 illustrates a deep-ring-trench termination structure. The deep-ring-trench termination structure includes a deep ring trench (not labeled), a dielectric material 10 formed in the deep ring trench; and a field plate 11 formed on the dielectric material 10. The field plate 11 covers a portion of the dielectric material 10.

A bias voltage is applied on the field plate 11, the equipotential line "A" terminates in the dielectric material 10. Thus, it prevents the electric field from accumulating in the power device. The deep ring trenches have a relatively large depth. Thus, the termination structure occupies a relatively small area of the substrate. However, to prevent the current leakage issue on the outer side surface of the deep ring trench, a doping region 12 is formed around the dielectric material 10 by a doping process with a doping type opposite to the doping type of the substrate 1. When a bias voltage is applied on the doping region 12, the carriers in the doping region 12 diffuse downwardly; and accumulate on the outer side surface of the deep-ring trench. The accumulated carriers limit the electric field in the dielectric material 10; the current leakage on the outer side surface of the deep ring trench is affective inhibited.

During the fabrication process of the deep-ring-trench termination structure, it needs extra processes to form the doping region 12. Thus, the production cost may be increased. Further, the extra processes would affect the electrical properties of other device structures on the substrate 1.

Figure 4:
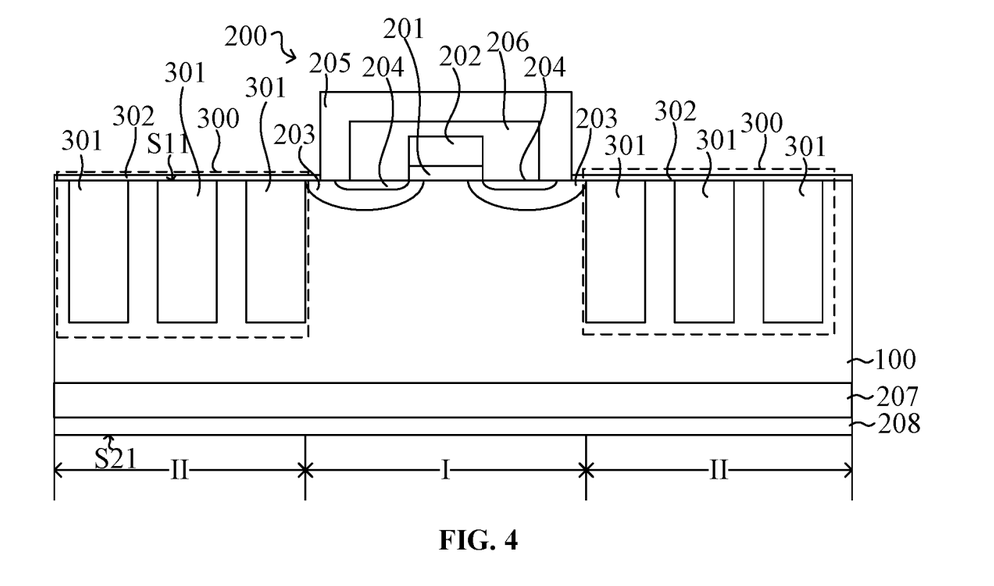
FIG. 4 illustrates an exemplary power semiconductor device consistent with the disclosed embodiments.

FIG. 4 illustrates an exemplary power semiconductor device with a termination structure consistent with the disclosed embodiments. As shown in FIG. 4, the power semiconductor device includes a substrate 100. The substrate 100 may have a device region I and a termination region II surrounding the device region I. Further, the substrate 100 may have a first surface S1 and an opposite facing second surface S2. The substrate 100 may be doped with first type doping ions. In one embodiment, the first type doping ions are N-type ions.

The power semiconductor device may also include a power device 200 formed in the substrate 100 in the device region I. The power device 200 may be any appropriate power device. In one embodiment, the power device 200 is an IGBT.

Specifically, the power device 200 may include a gate dielectric layer 201 formed on the surface of the substrate 100; and a gate 202 formed on the gate dielectric layer 201. The power device 200 may also include well regions 203 formed in the first surface S11 of the substrate 100 at both sides of the gate 202. The well regions 203 may be doped with second type doping ions. In one embodiment, the second type doping ions are P-type ions. Further, the well regions 203 may penetrate under the gate dielectric layer 202 along the first surface S1 with a predetermined lateral scale.

For illustrative purposes, two well regions 203 are illustrated in FIG. 4. In certain other embodiments, the distribution of the well regions 203 may be dependent of the specific device structure. For example, a plurality of well regions 203 may be formed in the substrate 100 at one side of the gate 202, or around the gate 202.

Further, the power device 200 may also include source regions 204 formed in the well regions 203 at both sides of the gate 202. The source regions 204 may be doped with the first type doping ions. The sources regions 204 and the well regions 203 may be short-circuited by an electrode 205. The electrode 205 and the gate 202 may be insulated by an interlayer dielectric layer 206. The electrode 205 may be configured as an emitter of the IGBT. Further, the power device 200 may also include a buffer layer 207 formed on the second surface S2 of the substrate 100; and a collector layer 208 formed on the buffer layer 207.

Further, as shown in FIG. 4, the power semiconductor device may include a termination structure 300 formed on the substrate 100 in the termination region II. Specifically, the termination structure 300 may include a plurality of ring trenches (not labeled) formed in the first surface S1 of the substrate 100; and a semiconductor plug 301 formed in each of the plurality of ring trenches. For illustrative purposes, three ring trenches are shown in FIG. 4. Accordingly, three semiconductor plugs 301 are illustrated.

For the three ring trenches, the outer ring trench may surround the inner ring trench. The three ring trenches 301 may align along the radial direction with a pre-determined intervals. That is, the three ring trenches may be concentric.

The semiconductor plugs 301 may be doped with second type doping ions. The second type and the first type may be opposite. Specifically, in one embodiment, the first type is N-type. Thus, the second type is P-type. In certain other embodiments, the first type is P-type. Thus, the second type is N-type.

Further, a protective layer 302 may be formed on the first surface S11 in the termination region II. The protective layer 302 may be used to prevent the semiconductor plugs 301 from being contaminated. The protective layer 302 may be made of any appropriate material, such as silicon oxide, or silicon nitride, etc.

Further, as shown in FIG. 4, the power semiconductor device may also include a buffer layer 207 formed in the second surface S2 of the substrate 100; and a collector layer 208 formed on the buffer layer 207.

During the turning-off process of the power device 200, an electric field may be formed in the substrate 100. Thus, comparing with the well regions 203, the substrate 100 may have a positive voltage. Because the substrate 100 may be N-type doped; and the well regions 203 may be P-type doped, the PN junctions between the substrate 100 and the well regions 203 may be reversely biased. The maximum bias voltage that reversely biased PN junctions are able to endure may be referred as the breakdown voltage of the power device 200.

Figure 5:
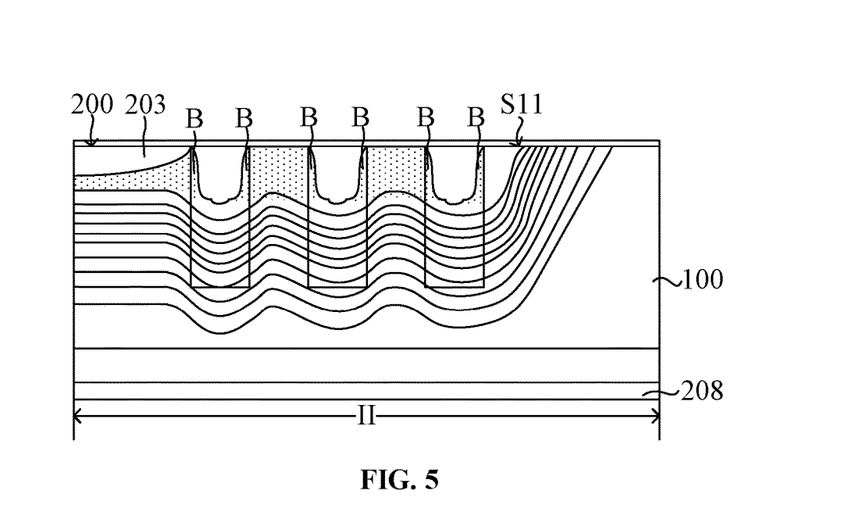
FIG. 5 illustrates the equipotential lines of a power device at off state consistent with the disclosed embodiments.

FIG. 5 illustrates the equipotential lines of the power device 200 in the termination region II at off state. The semiconductor plugs 301 and the substrate 100 may be doped with opposite types of doping ions, and PN junctions may be formed. On the side surface of each ring trench close to first surface S1 of the substrate 100, the holes in the substrate 100 may laterally diffuse into the semiconductor plugs 301; and the electrons in the semiconductor plugs 301 may laterally diffuse into the substrate 100. Thus, depletion layers B, as shown as the filled regions in FIG. 5, may be formed.

With the increase of the reverse bias voltage, the depletion layers B between adjacent semiconductor plugs 301 may connect. The depletion layers B in the semiconductor plugs 201 close to the well regions 203 may connect with the depletion layers B in the substrate 100 close to the well regions 203. The number of the holes in the substrate 100 diffusing into the well regions 203 may be reduced. Thus, the accumulation of the electric field generated in the first surface S11 of the substrate 100 during the turning-off process of the power device 200 may be reduced. Accordingly, the electric field may diffuse toward the termination region; and the reverse bias endured by the PN junctions formed between the well regions 203 and the substrate 100 may be relatively reduced. Therefore, it may effectively prevent the power device 200 from being broken down in advance; and the breakdown voltage of the power semiconductor device may be enhanced.

The breakdown voltage of the power semiconductor device may be represented by the maximum positive voltage applied on the collector layer 208 of the power semiconductor device. The higher the breakdown voltage is, the larger the positive voltage applied on the collector layer 208 is. A higher breakdown voltage of the power semiconductor device may enable the power semiconductor device to have broader applications.

Referring to FIG. 4, in the termination structure 300, the plurality of ring trenches may be deep ring trenches. A doped semiconductor plug 301 may be formed in the each of the plurality of deep ring trenches. Thus, it may not need to form extra doping regions. Accordingly, the fabrication process may be simplified; and it may prevent the processes for forming doping regions from affecting the electric properties of other device structures on the power semiconductor device. Further, because the ring trenches may be relatively deep, it may not need to form a significantly large number of ring trenches. For example, the ring trenches may be at least one. Thus, the area of the first surface S11 of the substrate 100 occupied by the ring trenches (semiconductor plugs 301) may be reduced; and the critical dimension of the power semiconductor device may be relatively small.

Further, in one embodiment, the semiconductor plugs 301 may be made of polysilicon. The lifetime of the carriers in polysilicon may be relatively short. The lifetime of the carriers may refer to the average time between the generations of the carriers and the recombination of the carriers. The lifetime of the carriers may represent the relaxation characteristics of the carriers in the semiconductor material from a non-equilibrium condition to an equilibrium condition under the external impact, such as light, or electric field, etc. Polysilicon has a plurality of crystal grains and a plurality of grain boundaries between adjacent crystal grains.

On one hand, the carriers in polysilicon may be scattered by the grain boundaries; and the energy of the carriers may be rapidly consumed. Thus, the lifetime of the carriers in polysilicon may be relatively short. On the other hand, the grain boundaries may serve as the recombination centers of the carriers. The relatively large quantity of the recombination centers (grain boundaries) in polysilicon may facilitate the recombination of the carriers. Thus, the lifetime of the carriers may be reduced.

The lifetime of the carriers in polysilicon may be relatively short. Thus, during turning-off process of the power semiconductor device, the reverse leaking current of the termination structure 200 may be relatively low. Accordingly, the turning-off time may be reduced; and the power semiconductor device may be rapidly turned-off.

Further, the lifetime of the carriers may be affected by the density of grain boundaries and the density of the recombination centers. The density of grain boundaries and the density of the recombination centers may be affected by the fabrication process of the polysilicon. Thus, during the fabrication process of the polysilicon, the process parameters may be controlled to obtain a relatively large density of grain boundaries and recombination centers so as to obtain a short lifetime of the carriers.

The semiconductor plugs 301 may also be made of any other appropriate material, such as III-group semiconductor material, V-group semiconductor material, or a combination of different semiconductor materials, etc. Polysilicon may have a better filling ability and a better compactness. Thus, it may better fill the ring trenches with a relatively high depth-to-width ratio. The semiconductor plugs 301 made of polysilicon may be lack of voids. Thus, the voltage stability effect may be as designed. Further, the semiconductor plugs 301 made of polysilicon may have an uniform density and a relatively high compactness. Thus, the electric field may be uniformly distributed in substrate 100 during the turning-off process of the power semiconductor device.

Further, the number of the ring trenches of the termination structure 200, the depth of the ring trenches, the width of the ring trenches, the distance between adjacent ring trenches, the doping concentration of the semiconductor plugs 301 may be designed based upon the specific requirements of the power semiconductor device. The specific requirements may include that the power semiconductor device has a significantly improved breakdown voltage.

In certain other embodiments, the number of the ring trenches (or the semiconductor plugs 301) may be other appropriate number. The number of the ring trenches may be selected based upon the breakdown voltage of the power device 200 so as to form a power semiconductor device having a significantly high breakdown voltage. For a same power device, the number of the trenches may be proportional to the breakdown voltage of the power semiconductor device. That is, the more the trenches are, the stronger the breakdown voltage of the power semiconductor device is.

For a same power device 200, the more the number of the ring trenches is, the more the number of the depletion layers is. Thus, the spreading of the electric field may be bigger; and the electric field of the termination structure 300 may have more dividing voltages. Accordingly, the reverse bias voltage applied on the PN junctions formed between the substrate 100 and the well regions 203 may be significantly reduced; and it may effectively avoid the breaking-down of the power device 200. Thus, the breakdown voltage of the power device 200 may be increased.

Further, for the power device 200 having a relatively small breakdown voltage, it may need to dispose more numbers of ring trenches so as to cause the termination structure 300 to have more dividing voltage to the electric field. For the power device 200 having a relatively large breakdown voltage, it may only need to dispose less numbers of the ring trenches. The termination structure 200 may have less dividing voltage to the electric field; and it may still be able to match the required voltage endurance characteristic of the power semiconductor device.

However, when the number of the ring trenches is over a certain number, because the distance between the most outer ring trench and the power device 200 may be relative large, the voltage dividing effect may be significantly reduced. Thus, it may be difficult to further increase the breakdown voltage of the power device 200. Further, if the number of the trenches is relatively large, the termination structure 300 may occupy a relatively large area of the first surface S1 of the substrate 100. Accordingly, the size of the power semiconductor device may be relatively large.

In one embodiment, the number of the ring trenches in the termination structure 300 may be more than one. The distance between adjacent ring trenches may be affect the performance of the termination structure 300. If the distance between adjacent ring trenches is relatively large, the polysilicon in the inner ring trenches may be broken down by the electric field before the electric field spreads to the outer ring trenches. Thus, the power semiconductor device may fail. Further, if the distance between adjacent ring trenches is relatively large, the termination structure 300 may occupy a relatively large area of the first surface S1 of the substrate 100; and the size of the power semiconductor device may be relatively large. Thus, the distance between adjacent ring trenches may be designed based on the specific power device to improve the breakdown voltage.

The depth of the ring trenches (or the height of the semiconductor plugs 301) may be any appropriate value. In one embodiment, the depth of the ring trenches 301 is approximately 30 μm. Such a depth may not only ensure the power semiconductor device to the have a desired breakdown voltage; and but also prevent the semiconductor plugs 301 from being broken down. Thus, the failure of the termination structure 300 caused by the broking down of the semiconductor plugs 301 may be avoided.

Figure 6:
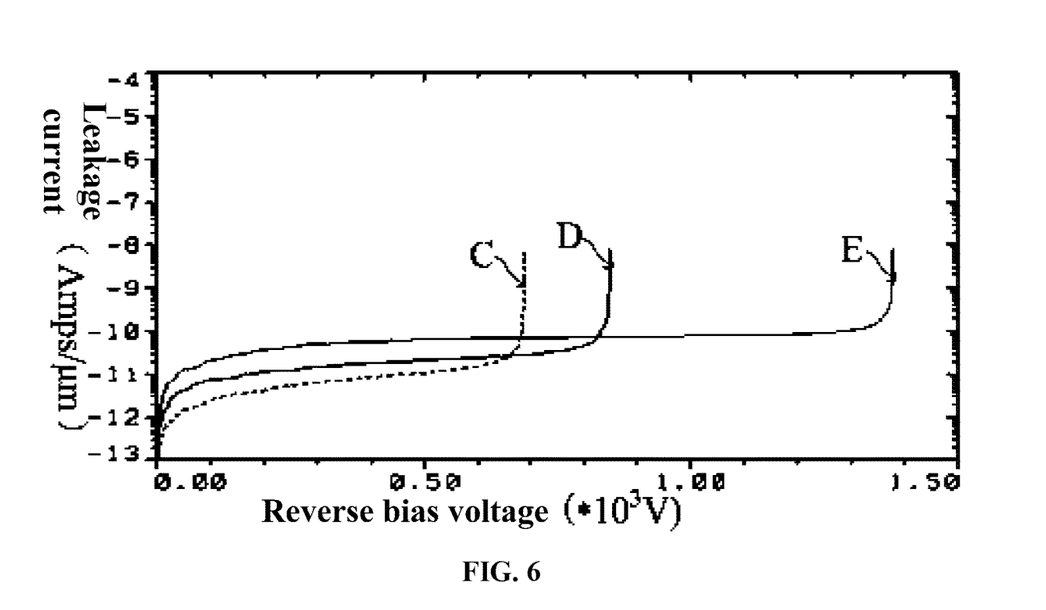
FIG. 6 illustrates an breakdown voltage improvement of a power semiconductor device consistent with disclosed embodiments, C: conventional terminal, D: shallow trenches, E: deep trenches.

FIG. 6 illustrates the breakdown voltage improvement of power semiconductor devices. The abscissa represents the reverse bias voltage; and the ordinate represents the leakage current. The value of the voltage at the corner of each of the curve lines may be referred as the breakdown voltage of the corresponding power semiconductor device. The breakdown voltage may refer to the maximum voltage that the collector layer of the power semiconductor device is able to endure.

The curve line "C" illustrates the reverse bias characteristics of a power device with a conventional termination structure. The corresponding breakdown voltage is 688V.

The curve line "D" illustrates the reverse bias characteristics of a power semiconductor device having a disclosed termination structure. The depth of the ring trenches in the termination structure is approximately 10 μm. The corresponding breakdown voltage is approximately 850V.

The curve line "E" illustrates the reverse bias characteristics of another power semiconductor device having a disclosed termination structure. The depth of the ring trenches in the termination structure is approximately 40 μm. The corresponding breakdown voltage is approximately 1380V.

Thus, as shown in FIG. 6, comparing with the power device having the conventional termination structure. The breakdown voltage of the power semiconductor devices having the disclosed termination structure may be significantly increased. Further, for a power device 200, the voltage endurance characteristics of the power semiconductor device is proportional to the depth of the ring trenches in the termination structure 300 of the power semiconductor device. The deeper the ring trenches are, the higher the breakdown voltage of the power semiconductor device is; and the stronger the breakdown voltage of the power semiconductor device is.

The relatively deep ring trenches may increase the volume of the depletion layers. The relatively large depletion layer region may significantly reduce the reverse bias voltage applied on the PN junctions formed between the substrate 100 and the well regions 203. Thus, the breakdown voltage of the power semiconductor device may be enhanced; and the breakdown voltage of the power semiconductor device may be increased. Thus, the depth of the ring trenches in the termination structure 300 may be designed based on the breakdown voltage of the power device 200. For the power device 200 with a relatively small breakdown voltage, the depth of the ring trenches may be designed to be relatively large so as to obtain the required breakdown voltage characteristic. For the power device 200 with a relatively large breakdown voltage, the depth of the ring trenches may be designed to be relatively small; and it may be still able to obtain a required breakdown voltage.

Further, if the ring trenches are substantially shallow, the electrons in the substrate 100 may diffuse into the semiconductor plugs 301, the semiconductor plugs 301 may be reversely doped. Thus, the semiconductor plugs 301 may be broken down; and may fail. Because the depletion layers may be formed on the side surfaces of the ring trenches close to the first surface S1 of the substrate 100, when the depth of the ring trenches reaches a certain value, it may be unable to effectively increase the breakdown voltage of the power semiconductor device even the depth of the ring trenches is further reduced. Furthermore, further increasing the depth of the ring trenches may increase the production cost of the power semiconductor device.

In one embodiment, the width of the ring trenches may also affect the breakdown voltage of the power semiconductor device. The width of the ring trenches is proportional to the breakdown voltage of the power semiconductor device. That is, the wider the ring trenches are; the stronger the breakdown voltage of the power semiconductor device is; and the greater breakdown voltage of the power semiconductor device is. When the width of the ring trenches is relatively large, the spreading area of the depletion layers may be increased; and the breakdown voltage of the power semiconductor device may be improved. The width of the ring trenches is relatively small, the depletions layers "B" may have overlaps in the semiconductor plugs 301 along the radius direction from the outer side surfaces to the inner side surfaces of the ring trenches. Thus, the semiconductor plugs 301 may be broken down; and the termination structure 300 may fail.

When the width of the ring trenches reaches a certain value, the distance between the depletion layers "B" of the outer side surfaces of the ring trenches in the semiconductor plugs 301 and the depletion layers "B" of the inner surfaces of the ring trenches in the semiconductor plugs 301 may be substantially small; and the breakdown issue may not exist, increasing the with the width of the ring trenches may be unable to effectively increase the breakdown voltage of the power semiconductor device. It may also increase the production cost of the power semiconductor device. Further, when the width of the ring trenches is relatively large, the termination structure 300 may occupy a relatively large area of the first surface S1 of the substrate 100. Thus, the size of the power semiconductor device may be relatively large. Therefore, the width of the ring trenches may be designed based on the specific requirements of the power semiconductor device to improve the breakdown voltage of the power semiconductor device.

Further, in one embodiment, the doping concentration of the semiconductor plugs 301 may also affect the breakdown voltage of the power semiconductor device. For a power device 200, the doping concentration of the semiconductor plugs 301 may be inversely proportional the breakdown voltage of the power semiconductor device. That is, the higher the doping concentration is, the worse the breakdown voltage of the power semiconductor device is; and the smaller the breakdown voltage of the power semiconductor device is.

If the doping concentration of the semiconductor plugs 301 is relatively high, the doping ions in the semiconductor plugs 301 may laterally diffuse into the substrate 100; and the depletion layers "B" may shift toward the power device 200. Such a shift may cause more carriers to diffuse from the substrate 100 to the well regions 203. Thus, the reversely biased PN junctions may be easily broken down; and the breakdown voltage of the power semiconductor device may not match the designed requirements. If the doping concentration of the semiconductor plugs 301 is relatively low, the carriers in the substrate 100 may laterally diffuse into the semiconductor plugs 301. Thus, the depletion layers "B" mays shift toward the semiconductor plugs 301; and the carriers diffusing into the well regions 203 may be reduced. Accordingly, the reversely biased PN junctions may not be easily broken down; and the breakdown voltage of the power semiconductor device may be enhanced.

However, the doping concentration of the semiconductor plugs 301 may not be substantially low. A substantially low doping concentration may cause the depletion layers "B" of the side surfaces of the ring trenches to overlap in the substrate 100. The overlaps may cause the termination structure 300 to fail. Thus, the doping concentration of the semiconductor plugs 301 may be chosen to improve the breakdown voltage of the power semiconductor device. Comparing with a power device 200 with a relatively small breakdown voltage, the doping concentration of the power device with a relatively large breakdown voltage may be relatively low.

Further, the number of the ring trenches in the termination structure 300, the depth of the ring trenches, the width of the ring trenches, the distance between adjacent ring trenches, and the doping concentration of the semiconductor plugs 301 may be interdependent for improving the breakdown voltage of the power semiconductor device. For example, if the number of the ring trenches is relatively large, the depth of the ring trenches may be relatively small. If the depth of the ring trenches is relatively small, the number of the ring trenches may be relatively large. If the width of the ring trenches is relatively large, the doping concentration of the semiconductor plugs 301 may be relatively small. All in all, such parameters of the termination structure 300 may be optimized to occupy the minimum area of the first surface S1 of the substrate 100; and to obtain a desired breakdown voltage of the power semiconductor device.

Further, in one embodiment, the power device 200 may be an IGBT. In certain other embodiments, the power device 200 may be other appropriate devices, such VDMOS FETs, etc.

Figure 13:
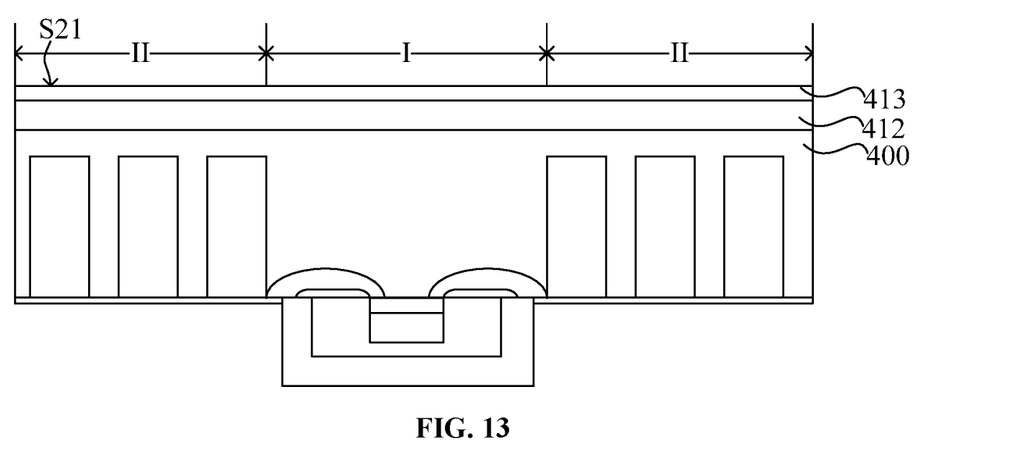
Figure 14:
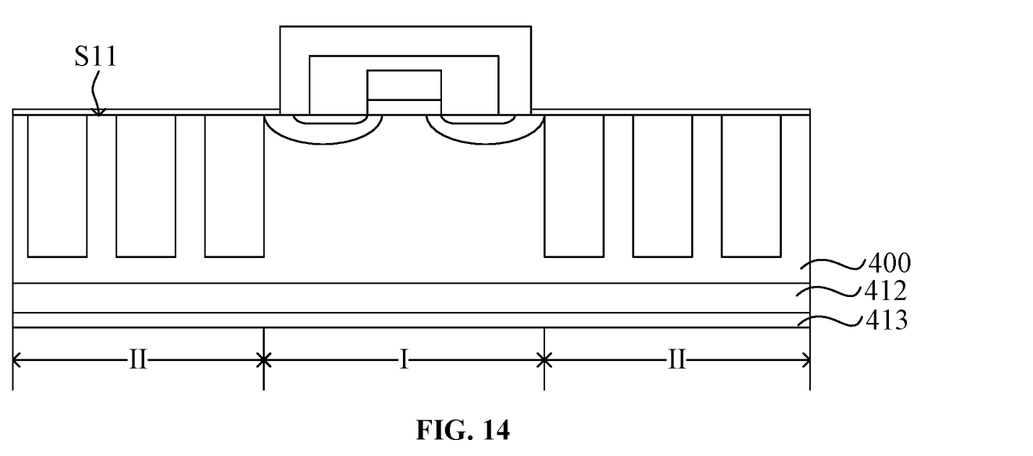
Figure 15:
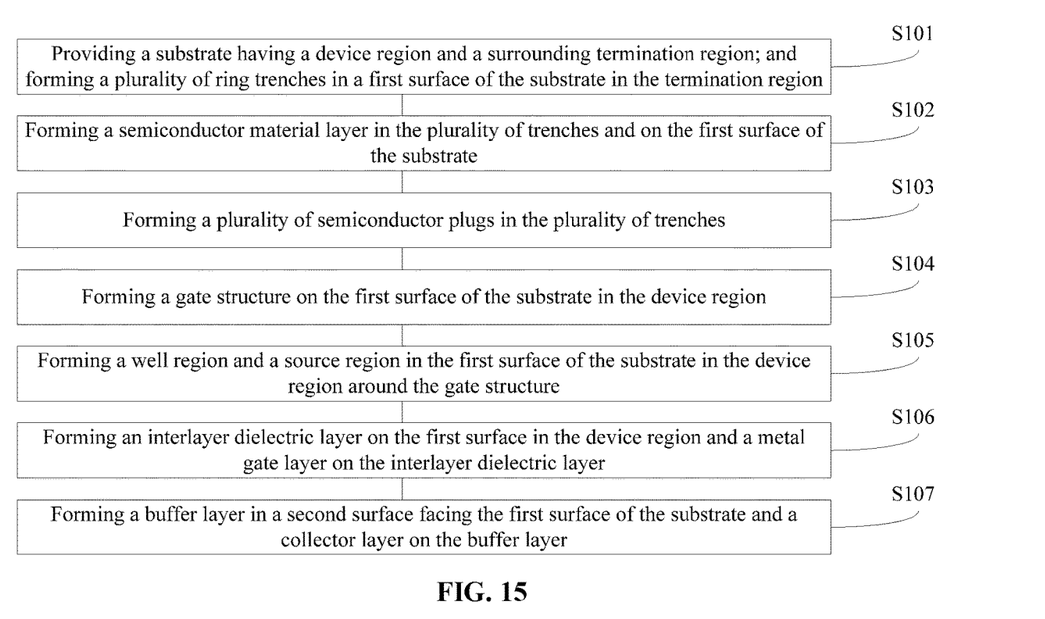
FIG. 15 illustrates an exemplary fabrication process of a power semiconductor device consistent with the disclosed embodiments.

FIG. 15 illustrates an exemplary fabrication process of a power semiconductor device consistent with the disclosed embodiments. FIGS. 7~14 illustrate semiconductor structures corresponding to certain stages of the exemplary fabrication process.

Figure 7:
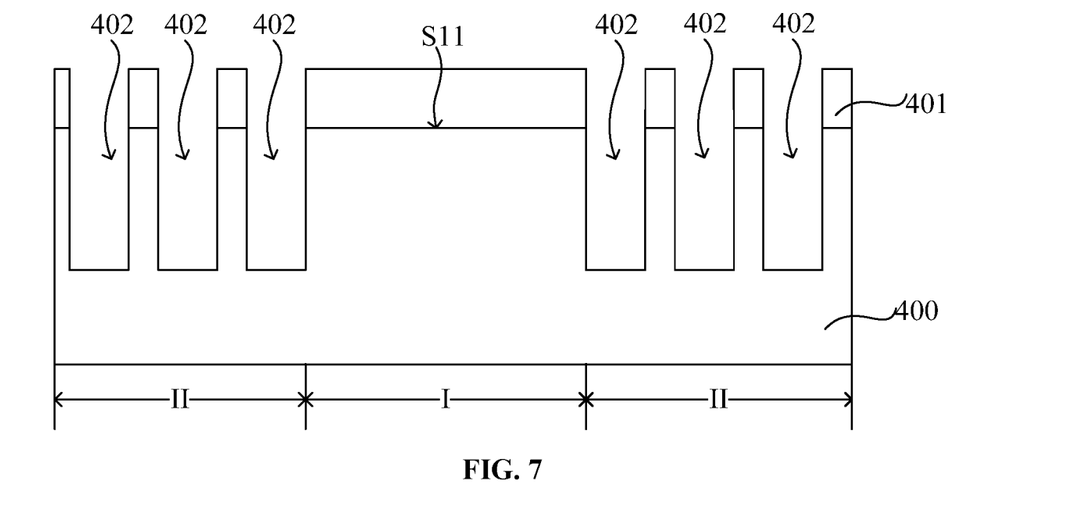
FIGS. 7~14 illustrate semiconductor structures corresponding to certain stages of an exemplary fabrication process of a power semiconductor device consistent with the disclosed embodiments.

As shown in FIG. 15, at the beginning of the fabrication process, a substrate with certain structures is provided (S101). FIG. 7 illustrates a corresponding semiconductor structure.

As shown in FIG. 7, a substrate 400 is provided. The substrate 400 may have a device region I and a ring termination region II surrounding the device region I. Further, the substrate 400 may have a first surface S11. A mask layer 401 may be formed on the first surface S11 of the substrate 400. Further, a plurality of ring trenches 402 may be formed in the first surface S1 of the substrate 400 in the ring termination region II.

The substrate 400 may be made of any appropriate semiconductor materials, such as single crystal silicon, polysilicon, silicon on insulator (SOI), silicon germanium, carborundum, indium antimonite, lead telluride, indium arsenide, indium phosphide, gallium arsenide, gallium antimonite, alloy semiconductor, or a combination thereof. In one embodiment, the substrate 400 is made of silicon. Thus, the production cost of the power semiconductor device may be reduced. The substrate 400 provides a base for subsequent devices and processes.

The substrate 400 may be doped with any appropriate type of ions. In one embodiment, the substrate 400 is doped with first type doping ions. The first type may be N-type.

The mask layer 401 may be a patterned mask layer to define the size and the positions of the ring trenches 402. The mask layer 401 may be made of any appropriate material. In one embodiment, the mask layer 401 is made of photoresist. The photoresist may be patterned by a standard photolithography process to form the patterned mask layer 401.

The plurality of ring trenches 402 may be used to subsequently form a plurality of semiconductor plugs in the substrate 400 in the ring termination region II. The plurality of ring trenches 402 may be concentric rings.

A process for forming the plurality of ring trenches 402 may include forming the patterned mask layer 401 on the first surface S11 of the substrate 400 to define the size and positions of the plurality of ring trenches 402; and etching the substrate 400 using the patterned mask layer 401 as an etching mask. Thus, the plurality of ring trenches 402 may be formed. The substrate 400 may be etched by any appropriate process, such as a dry etching process, a wet etching process, or an ion beam etching process, etc.

Figure 8:
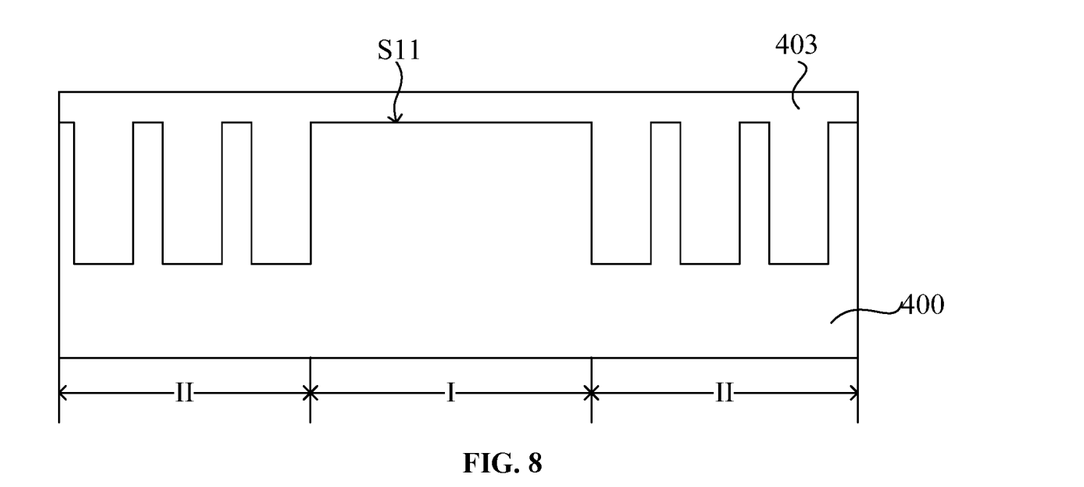
Figure 9:
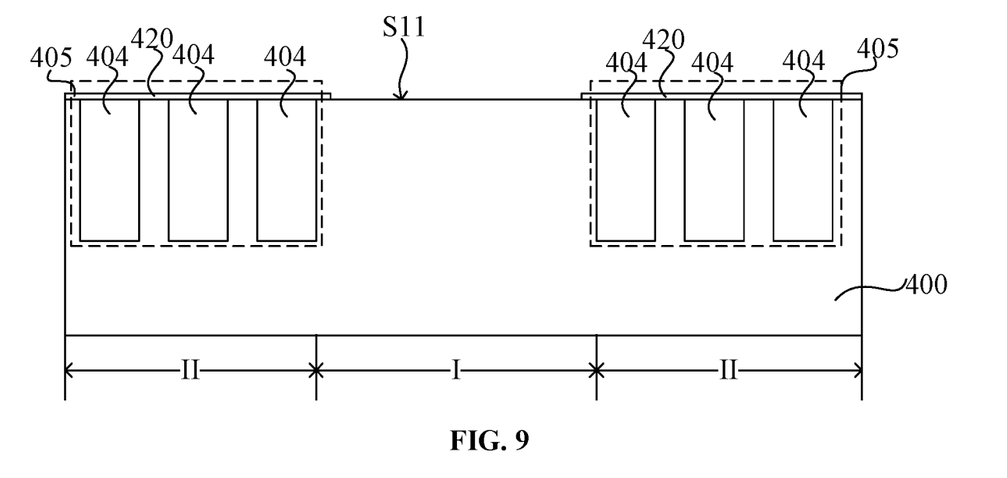

Returning to FIG. 15, after forming the plurality of ring trenches 402, the mask layer 401 may be removed; and a semiconductor material layer may be formed in the plurality of ring trenches 402 (S102). FIG. 8 illustrates a corresponding semiconductor structure.

As shown in FIG. 8, a semiconductor material layer 403 is formed in each of the plurality of ring trenches 402 and on the first surface S11 of the substrate 400. Before forming the semiconductor material layer 403, the patterned mask layer 401 may be removed.

The patterned mask layer 401 may be removed by any appropriate process, such as a wet etching process, a dry etching process, or a plasma ashing process, etc. In one embodiment, the mask layer 401 is made of photoresist, a plasma ashing process may be used to remove the mask layer 401.

The semiconductor material layer 403 may be made of any appropriate materials, such as polysilicon, III-group semiconductor material, V-group semiconductor material, or a combination of different semiconductor materials, etc., as long as the semiconductor material has an acceptable filling ability. In one embodiment, the semiconductor material layer 403 is made of polysilicon.

Various processes may be used to form the semiconductor material layer 403, such as a chemical vapor deposition (CVD) process, a physical vapor deposition (PVD) process, an atomic layer deposition (ALD) process, or a flowable CVD (FCVD) process, etc. In one embodiment, the semiconductor material layer 403 is formed by a CVD process. During the CVD process, the semiconductor material layer 403 may be in-situ doped with a second type doping ions. In one embodiment, the second type doping ions are P-type ions. By in-situ doping the semiconductor material layer 403, an uniform doping may be obtained in the semiconductor material layer 403 when the depth of the ring trenches 402 is relatively large.

Returning to FIG. 15, after forming the semiconductor material layer 403, a plurality of semiconductor plugs may be formed (S103). FIG. 8 illustrates a corresponding semiconductor structure.

As shown in FIG. 8, a semiconductor plug 404 is formed in each of the plurality of ring trenches 402. The semiconductor plugs 404 may be formed by planarizing the semiconductor material layer 403 until the first surface S11 of the substrate 400 is exposed. Thus, the semiconductor material left in the plurality of ring trenches 402 may form the plurality of semiconductor plugs 404; the top surfaces of the semiconductor plugs 404 may level with the first surface S1 of the substrate 400. The semiconductor material layer 403 may be planarized by any appropriate process, such as a chemical mechanical polishing process, or an etch back process, etc.

Further, after forming the plurality of semiconductor plugs 404, a protection layer 420 may be formed on the first surface S11 of the substrate 400 in the termination region II and the surfaces of the semiconductor plugs 404. The protection layer 420 may be used to prevent the surface of the semiconductor plugs 404 and the first surface S11 of the substrate 400 in the termination region II from being contaminated during subsequent processes.

The protection layer 420 may be made of any appropriate material, such as silicon oxide, silicon nitride, or silicon oxynitride, etc. Various processes may be used to form the protection layer 420, such as a CVD process, or a PVD process, etc.

Thus, a termination structure 405 may be formed. The termination structure 405 may include a plurality of ring trenches (not labeled); and a plurality of semiconductor plugs 404 formed in the ring trenches. For illustrative purposes, three ring trenches (or semiconductor plugs 404) are shown.

The number of the ring trenches 402 may be chosen based on the breakdown voltage of the subsequently formed power device. The number of the ring trenches 402 may be proportional to the breakdown voltage of the power semiconductor device. That is, the more the number of the ring trenches 402 is, the stronger the breakdown voltage of the power semiconductor device is; and the higher the breakdown voltage is.

Further, the depth of the ring trenches 402 may be proportional to the breakdown voltage of the power semiconductor device. That is, the larger the depth of the ring trenches 402 is, the stronger the breakdown voltage of the power semiconductor device is.

Further, the width of the ring trenches 402 may be proportional to the breakdown voltage of the power semiconductor device. That is, the larger the width of the ring trenches is, the stronger the breakdown voltage of the power semiconductor device is.

Further, the doping concentration of the semiconductor plugs 404 may be inversely proportional to the breakdown voltage of the power semiconductor device. That is, the larger the doping concentration is, the worse the breakdown voltage of the power semiconductor device is.

Figure 10:
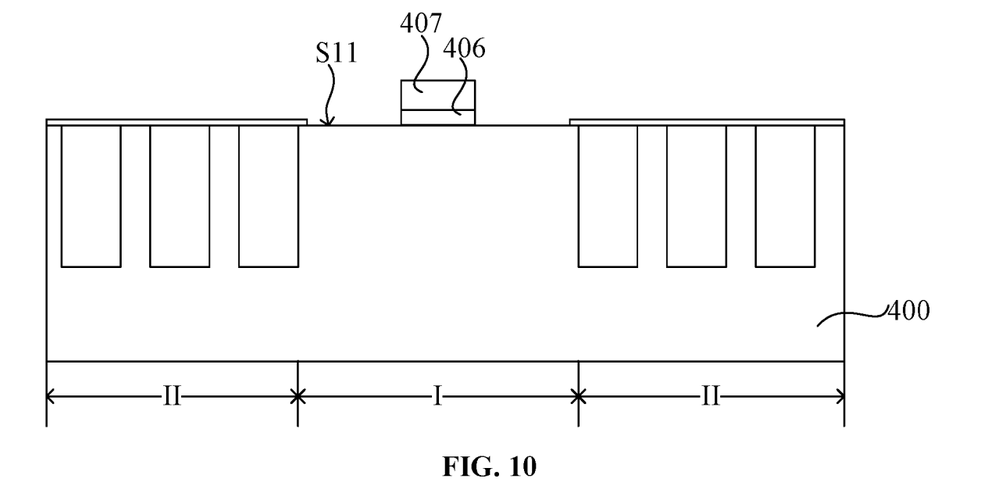

Returning to FIG. 15, after forming the termination structure 405, a gate structure may be formed (S104). FIG. 10 illustrates a corresponding semiconductor structure.

As shown in FIG. 10, a gate structure (not labeled) is formed on the first surface S1 of the substrate 400 in the device region I. The gate structure may include a gate dielectric layer 406 formed on the first surface S11; and a gate electrode 407 formed on the gate dielectric layer 406.

The gate dielectric layer 406 may be made of any appropriate material, such as silicon oxide, silicon oxynitride, or high dielectric constant material, etc. In one embodiment, the gate dielectric layer 406 is made of silicon oxide.

The gate electrode 407 may be made of any appropriate material, such as polysilicon, or metal material, etc. In one embodiment, the gate electrode 407 is made of polysilicon.

A process for forming the gate structure may include forming a gate dielectric material layer on the first surface S11 of the substrate 400; forming a gate material layer on the gate dielectric material layer; and followed by patterning the gate material layer and the gate dielectric material layer. Thus, the gate dielectric layer 406 and the gate electrode 407 may be formed.

The gate dielectric material layer and the gate material layer may be formed by any appropriate process, such as a CVD process, a PVD process, an ALD process, or an FCVD process, etc. Various processes may be used to pattern the gate dielectric material layer and the gate material layer, such as a dry etching process, a wet etching process, or an ion beam etching process, etc.

For illustrative purposes, one gate structure is shown in FIG. 10. In certain other embodiments, more than one gate structure may be formed on the substrate 400.

Figure 11:
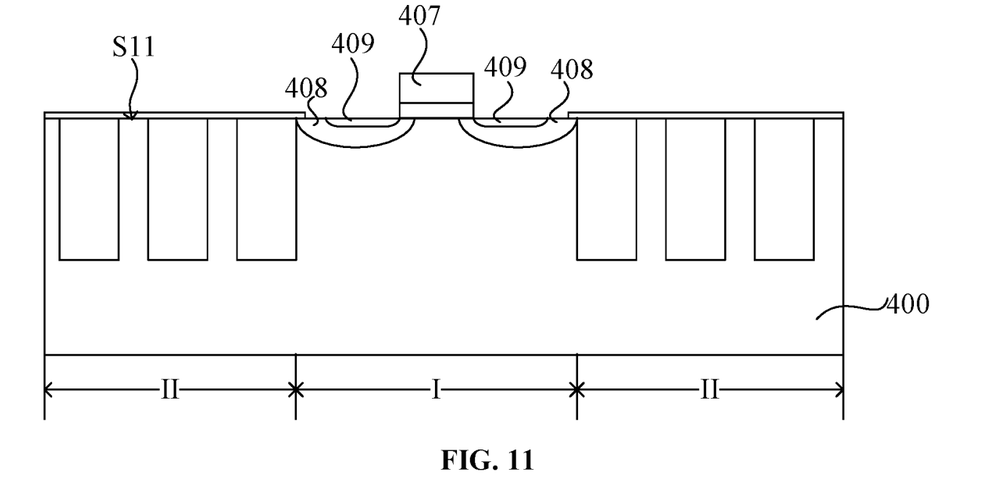

Returning to FIG. 15, after forming the gate structure, a first ion implantation process may be performed (S105). FIG. 11 illustrates a corresponding semiconductor structure.

As shown in FIG. 11, a first ion implantation process is performed on the first surface S1 at both sides of the gate structure; well regions 408 are formed in first surface S11 around the gate structure. The doping type of the first ion implantation process may be the second type. That is, in one embodiment, the well regions 408 may be P-type doped. Further, the well regions 408 may penetrate under the gate structure along the first surface S11 with a certain lateral scale.

In one embodiment, the first ion implantation process may be an inclining ion implantation process to cause the well regions 408 to penetrate under the gate structure. In the certain other embodiments, after the ion implantation process, a drive-in process may be performed to cause the doping ions to diffuse under the gate structure; and the well regions 408 may penetrate under the gate structure.

Further, after forming the well regions 408, a second ion implantation process may be performed in the well regions 408 around the gate structure; and source regions 409 may be formed in the well regions 408. Comparing with the well regions 408, the source regions 409 may be heavily doped. In one embodiment, the doping ions of the second ion implantation process may be the first type doping ions. That is, in one embodiment, the source regions 409 may be N-type doped. Further, the portions of the well regions 408 penetrating under the gate structure and close to the first surface S11 may be used to form a channel region.

In certain other embodiments, the well regions may be formed first. Then, the gate structure may be formed.

Figure 12:
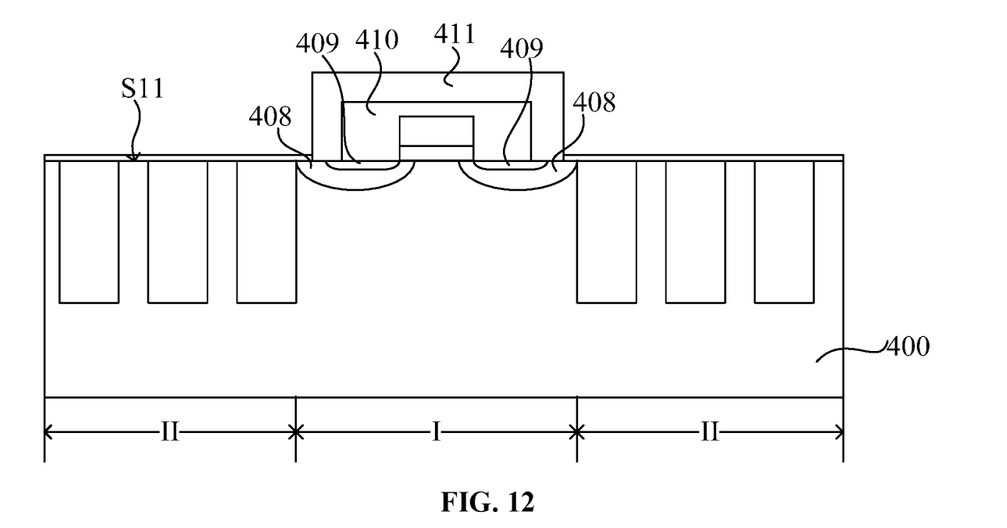

Returning to FIG. 15, after forming the source regions 409, an interlayer dielectric layer and a metal gate layer may be formed (S106). FIG. 12 illustrates a corresponding semiconductor structure.

As shown in FIG. 12, an interlayer dielectric layer 410 is formed on the first surface S1 of the substrate 400 in the device region I and the surfaces of the gate structure. The interlayer dielectric 410 may cover portions of the source regions 409 close to the gate structure; and may expose portions of the surfaces of the source regions 409 connecting with the well regions 408.

Further, a metal gate layer 411 may be formed on the top and the side surfaces of the interlayer dielectric layer 410. The metal gate layer 411 may cover the portions of the surfaces of the well regions 408 close to the source regions 409 and the portions of the surfaces of the source regions 409 close to the well regions 408. That is, the metal gate layer 411 may short-circuit the source regions 409 and the well regions 408.

The interlayer dielectric layer 410 may be made of any appropriate material, such as silicon oxide, silicon nitride, or silicon oxynitride, etc. Various processes may be used to form the interlayer dielectric layer 410, such as a CVD process, a PVD process, or an ALD process, etc.

The metal gate layer 411 may be made of any appropriate material, such as Cu, Al, or W, etc. Various processes may be used to form the metal gate layer 411, such as a CVD process, a PVD process, or an FCVD process, etc.

Returning to FIG. 15, after forming the metal gate layer 411, a buffer layer and a collector layer may be formed (S107). FIG. 13 illustrates a corresponding semiconductor structure.

As shown in FIG. 11, a buffer layer 412 may be formed in the second surface S2 of the substrate 400; and a collector layer 413 may be formed on the buffer layer 413. Before forming the buffer layer 412 and the collector layer 413, the substrate 400 may be thinned to a pre-determined thickness.

The collector layer 413 may be doped with the second type doping ions. That is, the collector layer 413 may be P-type doped. The buffer layer 412 may be doped with the first type doping ions. That is, the buffer layer 412 may be N-type doped. The doping concentration of the buffer layer 412 may be greater than the doping concentration of the substrate 400 so as to reduce the contact resistance.

A process for forming the buffer layer 412 and the collector layer 413 may include performing a third ion implantation process with the first type doping ions on the second surface S2 (the recessed surface) to a pre-determined depth. Thus, a heavily doped layer may be formed. The first type may be N-type.

After forming the heavily doped layer, a fourth ion implantation process with the second type doping ions may be performed to a pre-determined depth. Thus, the collector layer 413 may be formed in the second surface S21. The left portion of the heavily doped layer may form the buffer layer 412. The second type may be P-type.

Optionally or additionally, as shown in FIG. 14, after forming the buffer layer 412 and the collector layer 413, the power semiconductor device may be turned upside-down. Thus, the power device (IGBT) may be formed. That is, a power semiconductor device with a termination structure may be formed.

The IGBT may be formed after forming the termination structure 405. Such a process sequence may prevent the high-temperature process for forming the semiconductor material layer of the termination structure from affecting the electrical performance of the power device.

In certain other embodiments, a vertical double diffusion metal-oxide semiconductor (VDMOS) transistor may be formed in the device region of the substrate 400. The major difference between a VDMOS transistor and the IGBT may include that it may not need to form a collector layer on the second surface, i.e., the surface facing the surface having the gate structure, of the substrate.

According to the disclosed methods and structures, semiconductor plugs may be filled in the ring trenches of the termination structure of the power semiconductor device. The semiconductor material may be doped. Thus, it may not need to form field plates on the semiconductor plugs; and it may not need to dope the outer side surface of the ring trenches. Accordingly, the disclosed termination structure may be relatively simple; and the production cost may be relatively low.

Further, it may not need to dope the side surface of the ring trenches, the fabrication process of the termination structure may be simplified. It may also prevent the extra doping process from affecting the electrical performance of the other device structures on the substrate.

Further, the number of the ring trenches of the termination structure, the depth of the ring trenches, the width of the ring trenches, the distance between adjacent ring trenches, and the doping concentration of the semiconductor plugs may be optimized according to specific power semiconductor device. The optimized design may enable the power semiconductor device to have a desired breakdown voltage.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a power semiconductor device, comprising:
   providing a substrate having a device region and surrounding termination regions;
   forming at least one power device in the device region, the at least one power device comprising:
   a gate structure formed on a first surface of the substrate in the device region:
   a plurality of well regions formed in the first surface of the substrate at each side of the gate structure, the plurality of well regions penetrating under the gate structure;

forming a plurality of ring trenches in a first surface of the substrate in the termination regions, the plurality of ring trenches being within the termination regions of the substrate and the substrate being doped with ions: and forming a plurality of semiconductor plugs in the plurality of ring trenches, wherein;

the plurality of semiconductor plugs and the substrate form a termination structure of the power semiconductor device to insulate the at least one power device in the device region, when a reverse bias voltage between the substrate and the plurality of well region increases, depletion layers between adjacent semiconductor plugs connects, wherein the depletion layers in the semiconductor plugs close to the plurality of well regions connect with the depletion layers in the substrate close to the plurality of well regions;

the plurality of ring trenches include an inner ring trench and an outer ring trench, and the outer ring trench surrounds the inner ring trench, and the plurality of ring trenches include at least three trenches formed in the termination regions aside a first side of the device region and at least three trenches formed in the termination regions aside a second side of the device region.

2. The method according to claim 1, wherein:

a doping type of the substrate is different from a doping type of the semiconductor plugs.

3. The method according to claim 2, wherein:

the substrate is N-type doped; and the semiconductor plugs are P-type doped.

4. The method according to claim 1, wherein:

the power device is a Vertical Double-diffused Metal-oxide Semiconductor (VDMOS) field effect transistor.

5. The method according to claim 1, wherein:

the power device is an insulated-gate bipolar transistor.

6. The method according to claim 5, wherein forming the at least one power device further comprises:

forming a source region in each of the plurality of well regions around the gate structure;

forming a buffer layer in a second surface of the substrate around the gate structure; and forming a collector layer on the buffer layer.

7. The method according to claim 6, before forming the buffer layer further comprising:

thinning the substrate to a pre-determined thickness.

8. The method according to claim 1, wherein forming the plurality of ring trenches further comprises:

forming a patterned mask layer defining size and positions of the ring trenches on the first surface of the substrate;

etching the substrate in the termination region using the patterned mask as a mask layer to form the plurality of ring trenches; and removing the patterned mask layer.

9. The method according to claim 1, wherein forming the semiconductor plugs further comprises:

forming a semiconductor material layer in the plurality of ring trenches and on the first surface of the substrate; and planarizing the semiconductor material layer until the first surface is exposed, wherein the semiconductor material layer is in-situ doped.

10. The method according to claim 9, wherein:

the semiconductor material layer is planarized by one of a chemical mechanical polishing process and an etching back process.

11. The method according to claim 1, wherein:

the semiconductor plugs are made of polysilicon.

12. The method according to claim 1, wherein:

a total number of the ring trenches is more than one.

13. The method according to claim 12, wherein:

the plurality of ring trenches are concentric; and the plurality of ring trenches are uniformly distributed in the first surface of the substrate.

14. The method according to claim 1, wherein:

a protection layer is formed on the first surface of the substrate in the termination region and top surfaces of the plurality of semiconductor plugs.

* * * * *